United States Patent [19]

Seelbach et al.

[11] 4,423,339
[45] Dec. 27, 1983

[54] MAJORITY LOGIC GATE

[75] Inventors: Walter C. Seelbach, Fountain Hills; Boyd K. Hansen, Mesa, both of Ariz.

[73] Assignee: Motorola, Inc., Schaumburg, Ill.

[21] Appl. No.: 237,310

[22] Filed: Feb. 23, 1981

[51] Int. Cl.³ .................. H03K 19/23; H03K 19/092; H03K 19/094; H03K 5/08

[52] U.S. Cl. .................................. 307/464; 307/475; 307/561

[58] Field of Search ............... 307/443, 446, 450, 464, 307/475, 264, 559, 561, 565

[56] References Cited

U.S. PATENT DOCUMENTS 3,567,957  3/1971  Aten ..................................... 307/464
3,609,329  9/1971  Martin ............................. 307/464 X

OTHER PUBLICATIONS

Nuzillat et al., "A Subnanosecond Integrated Switching Circuit with MESFET's for LSI", IEEE-JSSC, vol. SC-11, No. 3, pp. 385-394, 6/76.

Van Tuyl et al., "High-Speed Integrated Logic with GaAs MESFET's", IEEE-JSSC, vol. SC-9, No. 5, pp. 269-276, 10/74.

Primary Examiner—Larry N. Anagnos
Attorney, Agent, or Firm—Vincent B. Ingrassia

[57]    ABSTRACT

A majority logic gate is comprised of a plurality of depletion mode switching devices and includes Schottky diodes for both level shifting and clamping the high logic level output voltage to ground. A plurality of MESFET input devices each have their gate electrode coupled to one input of the majority logic gate. Each MESFET input device has a source coupled to ground and a drain coupled to a current load device. The voltage level at the drain at each of the input devices changes from a logical "0" to a logical "1" state depending upon the number of inputs which are at a logical "1" level. The drain voltage is then level shifted down. The high logic level output voltage is clamped to ground by means of two Schottky diodes the first of which has a cathode coupled to ground and an anode coupled to the anode of the second diode, the cathode of the second diode being coupled to the output of the circuit.

5 Claims, 2 Drawing Figures

MAJORITY LOGIC GATE

BACKGROUND OF THE INVENTION

1. Field of the Invention

The invention relates generally to logic gates and, more particularly, to a majority logic gate wherein the high voltage state defined as a logical "1" output level is clamped to a predetermined voltage.

2. Description of the Prior Art

Majority logic gates are well-known and include an output which exhibits a predetermined logic level if a logical "1" is applied to a majority of a plurality of inputs. For example, if a majority logic gate has five inputs, a logical "0" will appear at the output if at least three of the inputs are coupled to a logical "1".

While known majority logic gates produce the majority output function, they suffer a serious disadvantage in that the output levels produced are not input compatible with external logic stages resulting in the necessity for output level requantizing.

SUMMARY OF THE INVENTION

It is an object of the present invention to provide an improved majority logic gate.

It is a further object of the present invention to provide a majority logic gate which includes means for clamping the high voltage state (logical "1") output to a predetermined voltage.

According to an aspect of the invention there is provided a logic gate, comprising: an input stage having an odd number of inputs, said input stage producing a first voltage when a majority of said inputs are coupled to a logical high voltage level and producing a second voltage when a majority of said inputs are coupled to a logical low voltage level; level shifting means coupled to said input stage for shifting said second and first voltages to produce said logical high and logical low voltages respectively; and means coupled to said level shifting means for clamping said logical high voltage level produced by said level shifting means in response to said second voltage to a predetermined voltage level.

The above and other objects, features and advantages of the present invention will be more clearly understood from the following detailed description taken in conjunction with the accompanying drawings, in which:

DESCRIPTION OF THE PREFERRED EMBODIMENT

Figure 1:
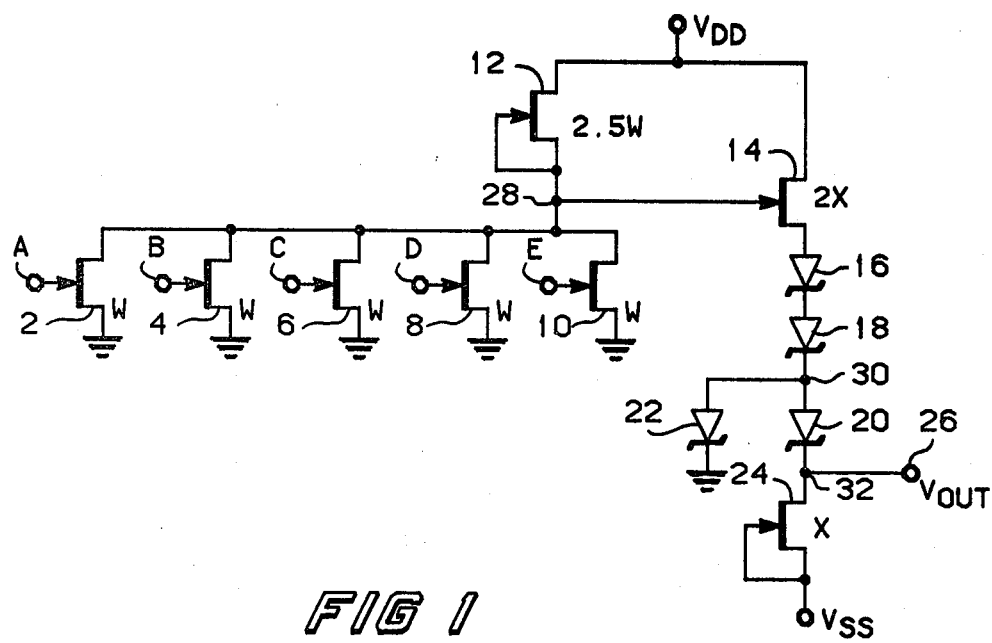
FIG. 1 is a schematic diagram of the inventive majority logic gate.

FIG. 1 is a schematic diagram of the inventive majority logic gate. An input stage comprises switching devices 2, 4, 6, 8 and 10 having inputs A, B, C, D and E respectively; a depletion load device 12; and an output stage including source follower 14, Schottky diodes 16, 18, 20 and 22, and device 24. The circuit output ($V_{out}$) appears at terminal 26. Each of switching devices 2, 4, 6, 8, 10, 12, 14 and 24 are metal Schottky field effect transistor (MESFETs). These are depletion type field effect transistors with an epitaxially grown silicon channel having a doping of about $10^{17}$ cm$^{-3}$ and a thickness in the order of 0.2 microns. In order to decrease parasitics, the substrate consists of high resistive silicon. Each device includes a Schottky gate which consists of an evaporative chromium nickel sandwich. Since MESFETs are well-known in the art, a detailed discussion of their characteristics is not deemed necessary. However, the interested reader is referred to (1) "An Improved Microwave Silicon MESFET" by W. Baechtold and P. Wolf, Solid State Electronics, Pergamon Press 1971, Vol. 14, Pages 783-790 and 2) "On The Scaling of Si-MESFETs" by G. V. Ram and Mielmasry, IEEE Electron Device Letters, Vol. EDL-1, No. 12, December, 1980.

As can be seen, each of device 2, 4, 6, 8 and 10 has a source coupled to ground and a drain coupled to the source of load device 12 which is in turn coupled to its gate. The drain of device 12 is coupled to a source of supply voltage $V_{DD}$ (typically 2-3 volts). Devices 2, 4, 6, 8 and 10 each have a channel width W while the channel width of device 12 corresponds to 2.5 W. Therefore, the current supplied by device 12 is 2.5 times greater than that which can be sunk by any one of devices 2, 4, 6, 8 or 10 when zero volts is applied at their respective inputs.

Each of the switching devices is of the depletion type. Such devices are normally on and have a negative threshold voltage. Thus, to turn any one of devices 2, 4, 6, 8 or 10 off, it is necessary to apply a voltage to its gate which is more negative than the threshold voltage. Let us assume that input terminals A, B, C, D and E are all coupled to a logical "1" (approximately 0 volts). Since these devices have a negative threshold voltage (e.g. −1 volt), the devices will remain on thus sinking all the current being supplied by device 12. If we assume now that input terminal A should drop below the threshold voltage (e.g. −2 volts), device 2 will shut off leaving devices 4, 6, 8 and 10 on. Devices 4, 6, 8 and 10 still have the capability of sinking all the current supplied by load device 12. The same would be true even if logical "0"s (−2 volts) were applied to any two input terminals since this would leave three conducting devices each having a channel width W. However, as soon as three inputs are coupled to a logical "0" leaving only two devices on, the two conducting devices cannot conduct all the current being sourced by device 12. Thus, for the first time, the voltage at the source of device 12 (also the gate of device 14) will rise to approximately $V_{DD}$. It should thus be clear that as long as a logical "1" is applied to a majority of devices 2, 4, 6, 8 and 10, all of the current sourced by device 12 will flow through the conducting switching devices leaving the source of device 12 at or near ground potential. As soon as less than a majority of input devices conduct, the voltage at the source of device 12 will increase. It should be clear that while only five input devices have been shown, any odd number of input devices may be employed by properly scaling the channel width of each of the input devices to that of the load device.

The majority gate offers a certain amount of versatility which may be illustrated as follows. If, for example, the D and E inputs of devices 8 and 10 respectively were coupled to a logical "1" (zero volts), node 28 will remain high until at least one of devices 2, 4, or 6 has a logical "1" applied to its input. When this happens, the voltage at node 28 will fall to near ground. This will be recognized as a three input NOR function wherein a high voltage appears at the output (node 28) only if a logical zero voltage (−2 volts) is applied to the gate electrodes of each of the input devices 2, 4, and 6.

Along these same lines, a three input NAND function may be achieved by tying the D and E gate electrodes of devices 8 and 10 to a logical "0" ($V_{SS}$). In this case, a high voltage state appears at node 28 until all of devices 2, 4 and 6 are turned on through the application of a logical "1" (zero volts) to their respective gate electrodes.

It is now been described how the voltage at node 28 is maintained at ground as long as a majority of inputs A, B, C, D and E have a logical "1" applied thereto and how the voltage at node 28 rises when the required majority is not present. The voltage at node 28 is applied to the gate electrode of device 14 which is a source follower for buffering the output from the load. Device 14 has its source-drain path coupled in series between the source of supply voltage $V_{DD}$ and a plurality of level shifting series coupled Schottky diodes 16, 18 and 20. The output terminal 26 ($V_{out}$) is coupled to node 32 between diode 20 and the drain of MESFET 24. The source and gate of MESFET 24 are coupled to $V_{SS}$ (e.g. $-2$ volts). As can be seen, source follower 14 has a channel width 2X which is twice that of MESFET 24.

It has already been stated that a logical "1" corresponds to zero volts and a logical "0" corresponds to approximately $-2$ volts. However, the voltage at the gate of device 14 (and therefore the source of device 14) varies from approximately 0 volts to approximately $+2$ volts. When the source of follower 14 is at 0 volts, current will flow through diodes 16, 18 and 20. Since each of these diodes represent the voltage drop of approximately 0.7 volts, the resultant logical "0" at node 32 will be approximately $-2.0$ volts. If, on the other hand, the voltage at the source of device 14 were approximately 2 volts, the voltage drops across diode 16, 18 and 20 would shift this voltage drop to approximately ground at node 32.

It is important that the high logic voltage level at node 32 be accurately controlled. This is accomplished as follows. An additional Schottky diode 22 is coupled between node 30 and ground as shown in FIG. 1. Diode 22 is identical to diode 20 and therefore the voltage drops across each of them will be the same when the same current flows through both. Furthermore, since the channel width of device 14 is twice that of device 24, the current flowing through diodes 16 and 18 will be split at node 30, half flowing through diode 20 and half flowing through diode 22. This clamps node 30 to a voltage above ground corresponding to the voltage drop across diode 22. Since this same voltage will be dropped across diode 20, node 32 is accurately set to ground representing the high logic level.

Figure 2:
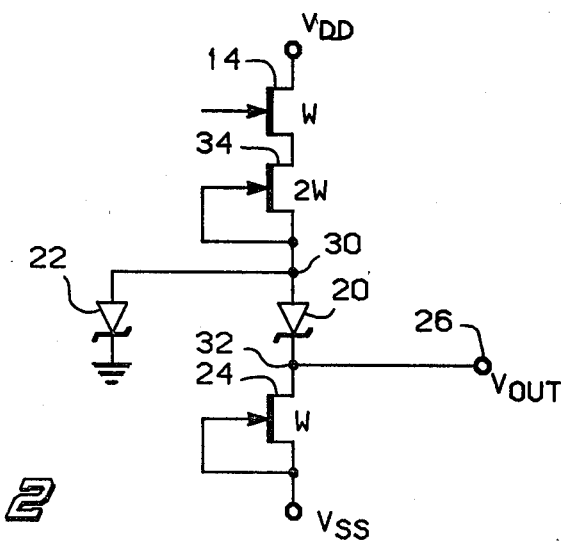
FIG. 2 illustrates an improvement to the circuit shown in FIG. 1.

The Schottky diodes do not track the MESFET switching devices. For example, the forward voltage drop of the diodes is independent of process variations. While changes in the resistivity of the semiconductor material changes the threshold voltage of the MESFETs substantially, it does not alter the voltage drop across the diodes. To avoid this, Schottky diodes 16 and 18 shown in FIG. 1 may be replaced by an additional MESFET 34 shown in FIG. 2 having its source coupled to its gate. Device 34 has a channel which is twice as wide as the channels in devices 14 and 24. The current through device 24 is $I_D$. As long as device 34 remains in the linear region, the voltage drop across it will be approximately equal to $V_T/2$ where $V_T$ is the threshold voltage. However, as the voltage at the source of device 14 increases, device 34 will go into saturation and will current limit at approximately $2I_D$. This forces a current of $I_D$ to flow through diode 22 which is the same as the current flowing through diode 20. The result is that node 32 will again be clamped to ground potential.

The above description is given by way of example only. Changes in form and details may be made by one skilled in the art without departing from the scope of the invention.

We claim:

1. A logic gate, comprising:
an input stage having an odd number of inputs, said input stage producing a first voltage when a majority of said inputs are coupled to a logical high voltage level and producing a second voltage when a majority of said inputs are coupled to a logical low voltage level, said input stage including,
an odd plurality of field effect transistors having a common drain and each having a source coupled to ground, the gate electrode of each of said field effect transistors comprising one of said odd number of inputs, and
a load field effect transistor having its source electrode coupled to its gate electrode and to the drain electrodes of said odd plurality of field effect transistors, said load field effect transistor having a drain electrode, coupled to a source of supply voltage, said first and second voltages being produced at the source of said load field effect transistor, each of said odd plurality of field effect transistors having a channel width such that a majority of said odd plurality of field effect transistors must be on to sink all current being sourced by said load field effect transistor;
level shifting means coupled to said input stage for shifting said second and first voltages to produce said logical high and logical low voltages respectively, said level shifting means including,
a source follower field effect transistor having a gate electrode coupled to the source of said load field effect transistor, a drain electrode coupled to said source of supply voltage and having a source electrode,
first, second and third series coupled Schottky diodes, the first of which having an anode coupled to the source of said source follower field effect transistor, and
an additional field effect transistor having a source electrode coupled to its gate electrode and to a second source of supply voltage and having a drain electrode coupled to the cathode of said third Schottky diode, said logical high and logical low voltages appearing at the drain electrode of said additional field effect transistor, said source follower field effect transistor being capable of conducting twice as much current as said additional field effect transistor; and
an additional Schottky diode having a cathode coupled to ground and an anode coupled to the anode of said third Schottky diode for clamping said logical high voltage level produced by said level shifting means in response to said second voltage to a predetermined voltage level.

2. A logic gate according to claim 1 wherein each of said field effect transistors is a metal Schottky field effect transistor.

3. A logic gate, comprising:
an input stage having an odd number of inputs, said input stage producing a first voltage when a majority of said inputs are coupled to a logical high voltage level and producing a second voltage when a majority of said inputs are coupled to a logical low voltage level, said input stage including, an odd plurality of field effect transistors having a common drain and each having a source coupled to ground, the gate electrode of each of said field effect transistors comprising one of said odd number of inputs, and a load field effect transistor having its source electrode coupled to its gate electrode and to the drain electrodes of said odd plurality of field effect transistors, said load field effect transistor having a drain electrode coupled to a source of supply voltage, said first and second voltages being produced at the source of said load field effect transistor, each of said odd plurality of field effect transistors having a channel width such that a majority of said odd plurality of field effect transistors must be on to sink all current being sourced by said load field effect transistor;

level shifting means coupled to said input stage for shifting said second and first voltages to produce said logical high and logical low voltages respectively, said level shifting means including, a source follower field effect transistor having a gate electrode coupled to the source of said load field effect transistor, a drain electrode coupled to said first source of supply voltage and having a source electrode;

a level shifting field effect transistor having a drain electrode coupled to the source electrode of said source follower field effect transistor and having a source electrode coupled to its gate electrode;

a first Schottky diode having an anode coupled to the source of said level shifting field effect transistor and having a cathode; and an additional field effect transistor having a source electrode coupled to its gate electrode and to a second source of supply voltage and having a drain electrode coupled to the cathode of said first Schottky diode, said logical high and logical low voltage appearing at the drain of said additional field effect transistor; and second Schottky diode having a cathode coupled to ground and an anode coupled to the anode of said first Schottky diode for clamping said logical high voltage level produced by said level shifting means in response to said second voltage to a predetermined voltage level.

4. A logic gate according to claim 3 wherein said level shifting field effect transistor has a channel width such that it is capable of conducting twice as much current as said source follower transistor and said additional field effect transistor.

5. A logic gate according to claim 4 wherein each of said field effect transistors are metal Schottky field effect transistors.

* * * * *